(12) United States Patent
Paasio et al.

(10) Patent No.: US 10,469,084 B2
(45) Date of Patent: Nov. 5, 2019

(54) LEVEL SHIFTER AND A METHOD FOR SHIFTING VOLTAGE LEVEL

(71) Applicant: Minima Processor Oy, Oulu (FI)

(72) Inventors: Ari Paasio, Littoinen (FI); Lauri Koskinen, Helsinki (FI); Matthew Turnquist, Espoo (FI)

(73) Assignee: Minima Processor Oy, Oulu (FI)

( * ) Notice: Subject to any disclaimer, the term of this patent is extended or adjusted under 35 U.S.C. 154(b) by 135 days.

(21) Appl. No.: 15/630,665

(22) Filed: Jun. 22, 2017

(65) Prior Publication Data
US 2017/0373691 A1 Dec. 28, 2017

(30) Foreign Application Priority Data

Jun. 23, 2016 (FI) .................................... 20165521

(51) Int. Cl.
| | | |
|---|---|---|
| H03L 5/00 | (2006.01) | |
| H03K 19/0185 | (2006.01) | |
| H03K 3/356 | (2006.01) | |
| H03K 19/00 | (2006.01) | |
| H03K 19/096 | (2006.01) | |

(52) U.S. Cl.
CPC ... *H03K 19/0185* (2013.01); *H03K 3/356113* (2013.01); *H03K 3/356121* (2013.01); *H03K 3/356191* (2013.01); *H03K 19/0013* (2013.01); *H03K 19/018521* (2013.01); *H03K 19/018585* (2013.01); *H03K 19/0963* (2013.01)

(58) Field of Classification Search
None
See application file for complete search history.

(56) References Cited

U.S. PATENT DOCUMENTS

| 5,490,119 A | 2/1996 | Sakurai et al. |
|---|---|---|
| 7,800,407 B1 * | 9/2010 | Agarwal ........ H03K 19/018521 |
| | | 326/68 |

(Continued)

FOREIGN PATENT DOCUMENTS

WO    WO 2011/097628 A1    8/2011

OTHER PUBLICATIONS

Finnish Search Report for corresponding Finnish Patent Application No. 20165521 dated Dec. 16, 2016, 2 pages.

(Continued)

*Primary Examiner* — Lincoln D Donovan
*Assistant Examiner* — Khareem E Almo
(74) *Attorney, Agent, or Firm* — Merchant & Gould P.C.

(57) ABSTRACT

A level shifter comprises a first control switch (207) for connecting an output terminal to a first supply voltage (VDDH) to set an output signal to be high, and a second control switch (208) for connecting the output terminal to a signal ground (GND) to set the output signal to be low. The level shifter comprises a pre-charging switch (210) for connecting the output terminal to the first supply voltage, and an input gate circuit (211) for controlling an ability of an input signal to control the second control switch. The level shifter comprises a keeper circuit (212) for controlling the first control switch based on the output signal. The first control switch is controlled with the first supply voltage when the output signal is low, and with a second supply voltage that is between the first supply voltage and the signal ground when the output signal is high.

9 Claims, 3 Drawing Sheets

(56) References Cited

U.S. PATENT DOCUMENTS

| | | |
|---|---|---|
| 7,808,294 B1 | 10/2010 | Kottapalli |
| 7,986,165 B1 | 7/2011 | Lin et al. |
| 8,860,488 B2 | 10/2014 | Chu |
| 2002/0047726 A1 | 4/2002 | Narendra et al. |
| 2003/0117179 A1 | 6/2003 | Hsu et al. |
| 2007/0176641 A1 | 8/2007 | Kursun et al. |
| 2007/0279092 A1* | 12/2007 | Wood ............ H03K 19/018521 326/81 |
| 2010/0026362 A1* | 2/2010 | Shankar ........... G01R 19/16519 327/333 |
| 2011/0037508 A1* | 2/2011 | Lundberg ............... H03K 3/012 327/333 |
| 2012/0002500 A1* | 1/2012 | Lin ................ H03K 19/018521 365/230.06 |
| 2012/0294095 A1* | 11/2012 | Shiu ..................... G11C 7/1057 365/189.11 |
| 2014/0253209 A1 | 9/2014 | Chu |
| 2015/0146478 A1* | 5/2015 | Ngo ...................... G11C 11/419 365/154 |
| 2015/0207506 A1 | 7/2015 | Song |
| 2016/0149579 A1* | 5/2016 | Trivedi .......... H03K 19/018521 326/81 |
| 2016/0307621 A1* | 10/2016 | Campbell .............. G11C 5/143 |
| 2017/0047930 A1* | 2/2017 | Chai ............... H03K 19/018528 |
| 2018/0083625 A1* | 3/2018 | Garg ..................... G11C 5/147 |

OTHER PUBLICATIONS

Extended European Search Report for corresponding European Patent Application No. 17177329.4 dated Nov. 16, 2017, 9 pages.

* cited by examiner

LEVEL SHIFTER AND A METHOD FOR SHIFTING VOLTAGE LEVEL

This application claims benefit of Serial No. 20165521, filed 23 Jun. 2016 in Finland and which application is incorporated herein by reference. To the extent appropriate, a claim of priority is made to the above disclosed application.

FIELD OF THE DISCLOSURE

The disclosure relates to a level shifter for producing an output signal based on an input signal. The disclosure relates also to an electronic device comprising one or more level shifters. Furthermore, the disclosure relates to a method for controlling a level shifter.

BACKGROUND

The energy consumption of an electronic device, such as a digital processor, is a critical issue in many cases. For example, technologies such as the Internet-of-Things "IoT", the Industrial Internet "II", and the Internet-of-Everything "IoE" are on the threshold of a massive breakthrough, and the major drivers behind the breakthrough are ubiquitous wireless processing nodes. However, the energy consumption of transmitting a bit across a given distance does not scale with Moore's law as advantageously as the digital processing within a wireless node. Therefore, the energy cost of wireless transmission will proportionally grow when compared to digital processing. Increasing the energy efficiency thus requires increasing the amount of intra-node processing in order to minimize the wireless transmission of data. Therefore, the processor and the digital signal processing "DSP" will become one of the, if not the, most important parts to be optimized. This will be compounded by the increasing functionalities of the wireless node, such as e.g. Machine Learning, Video, etc.

Increasing the energy efficiency may result in a design where different sections of an electronic device operate with different supply voltages. For example, in ultra-low-power processor scenarios, memory blocks may require supply voltages that are higher than supply voltages of processors. Thus, the memory blocks belong to a higher voltage domain of the electronic device whereas the processors belong to a lower voltage domain of the electronic device. In some cases and especially in conjunction with central processing units "CPU", a supply voltage of a processor is often called core voltage.

One or more level shifters is/are typically required in order to transfer digital data from a lower voltage domain operating at a lower voltage to a higher voltage domain operating at a higher voltage. The energy consumption of the level shifters needs to be minimized and is especially important for example in cases where wide data buses are under the need for level shifting.

A known approach to reduce energy consumption of a level shifter is to use pre-charging where the level shifter is pre-charged to the voltage of a higher voltage domain prior to transferring digital data from a lower voltage domain to the higher voltage domain. The pre-charging is typically called a pre-charging phase and the transfer of the digital data is typically called an evaluation phase. Level shifters where the pre-charging is used are presented e.g. in publications U.S. Pat. No. 8,860,488 and US20150207506. In the level shifters described in U.S. Pat. No. 8,860,488 and US20150207506, two cross coupled p-channel metal oxide semiconductor "PMOS" transistors are utilized and thus two separate discharging branches are needed. Publication WO2011097628 describes a level shifter where only one pre-charged branch and only one discharging path are needed and where the pre-charged output terminal of the level shifter is kept at a high logical value with the aid of a keeper circuit. The keeper circuit, however, needs gating information from another level shifter with a delay, and this arrangement increases the energy consumption as well as the layout area.

SUMMARY

The following presents a simplified summary in order to provide basic understanding of some aspects of various invention embodiments. The summary is not an extensive overview of the invention. It is neither intended to identify key or critical elements of the invention nor to delineate the scope of the invention. The following summary merely presents some concepts in a simplified form as a prelude to a more detailed description of exemplifying embodiments of the invention.

In accordance with the invention, there is provided a new level shifter for producing an output signal based on an input signal. A level shifter according to the invention comprises:
  an input terminal for receiving the input signal and an output terminal for outputting the output signal,
  a level shift circuit comprising a first control switch for connecting the output terminal to a first supply voltage so as to set the output signal to a first logical value and a second control switch for connecting the output terminal to a signal ground so as to set the output signal to a second logical value,
  a pre-charge circuit comprising a pre-charging switch for connecting the output terminal to the first supply voltage and an input gate circuit for controlling the ability of the input signal to control the second control switch, and
  a keeper circuit responsive to the output signal and for connecting the first supply voltage to the control terminal of the first control switch so as to keep the first control switch non-conductive when the output signal has the second logical value, and for connecting a second supply voltage to the control terminal of the first control switch so as to keep the first control switch conductive when the output signal has the first logical value.

During a pre-charging phase, the output terminal is charged via the pre-charging switch to the first supply voltage and the input gate circuit is controlled to disable the input signal from controlling the second control switch. During a subsequent evaluation phase, the pre-charging switch is non-conductive and the input gate circuit enables the input signal to control the second control switch.

As mentioned above, the control terminal of the first control switch is connected to the second supply voltage when the output signal has its first logical value. With suitable values of the second supply voltage, the ability of the first control switch to keep the output signal at the first logical value is sufficiently weak so that the second control switch is sufficiently strong to pull the output signal to the second logical value when the input signal corresponds to the second logical value and controls the second control switch. It is also possible to select the electrical properties of the first and second control switches, e.g. channel impedances in a case of metal oxide semiconductor "MOS" field-effect transistors, so that the ability of the first control switch to keep the output signal at the first logical value when controlled by the second supply voltage is sufficiently weaker than the ability of the second control switch to pull the output signal to the second logical value when the input signal corresponds to the second logical value and controls the second control switch.

In the above-described level shifter, there is no need for cross coupled switches and for two separate discharging branches. Furthermore, for being able to operate, the above-described level shifter does not need gating information from another level shifter.

In accordance with the invention, there is provided also a new method for controlling a level shifter of the kind described above. A method according to the invention comprises:

connecting the first supply voltage to the control terminal of the first control switch so as to keep the first control switch non-conductive when the output signal has the second logical value, and connecting the second supply voltage to the control terminal of the first control switch so as to keep the first control switch conductive when the output signal has the first logical value, the electric potential of the second supply voltage being between those of first supply voltage and the signal ground.

In accordance with the invention, there is provided also a new electronic device that comprises a first functional section and a second functional section, one or more level shifters according to the invention and configured to receive one or more input signals from the first functional section, produce one or more output signals based on the one or more input signals, and supply the one or more output signals to the second functional section, and a voltage supply circuit configured to produce the first supply voltage and the second supply voltage and supply the first and second supply voltages to the one or more level shifters, the electric potential of the second supply voltage being between those of first supply voltage and the signal ground.

The supply voltage of first functional section can be for example the second supply voltage, and the supply voltage of second functional section can be for example the first supply voltage. The first functional section may comprise for example one or more digital processors and the second functional section may comprise for example one or more memory circuits.

A number of exemplifying and non-limiting embodiments of the invention are described in accompanied dependent claims.

Various exemplifying and non-limiting embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of also un-recited features.

The features recited in the accompanied dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE FIGURES

Exemplifying and non-limiting embodiments of the invention and their advantages are explained in greater detail below with reference to the accompanying drawings, in which.

DESCRIPTION OF EXEMPLIFYING AND NON-LIMITING EMBODIMENTS

The specific examples provided in the description below should not be construed as limiting the scope and/or the applicability of the accompanied claims. Lists and groups of examples provided in the description below are not exhaustive unless otherwise explicitly stated.

Figure 1:
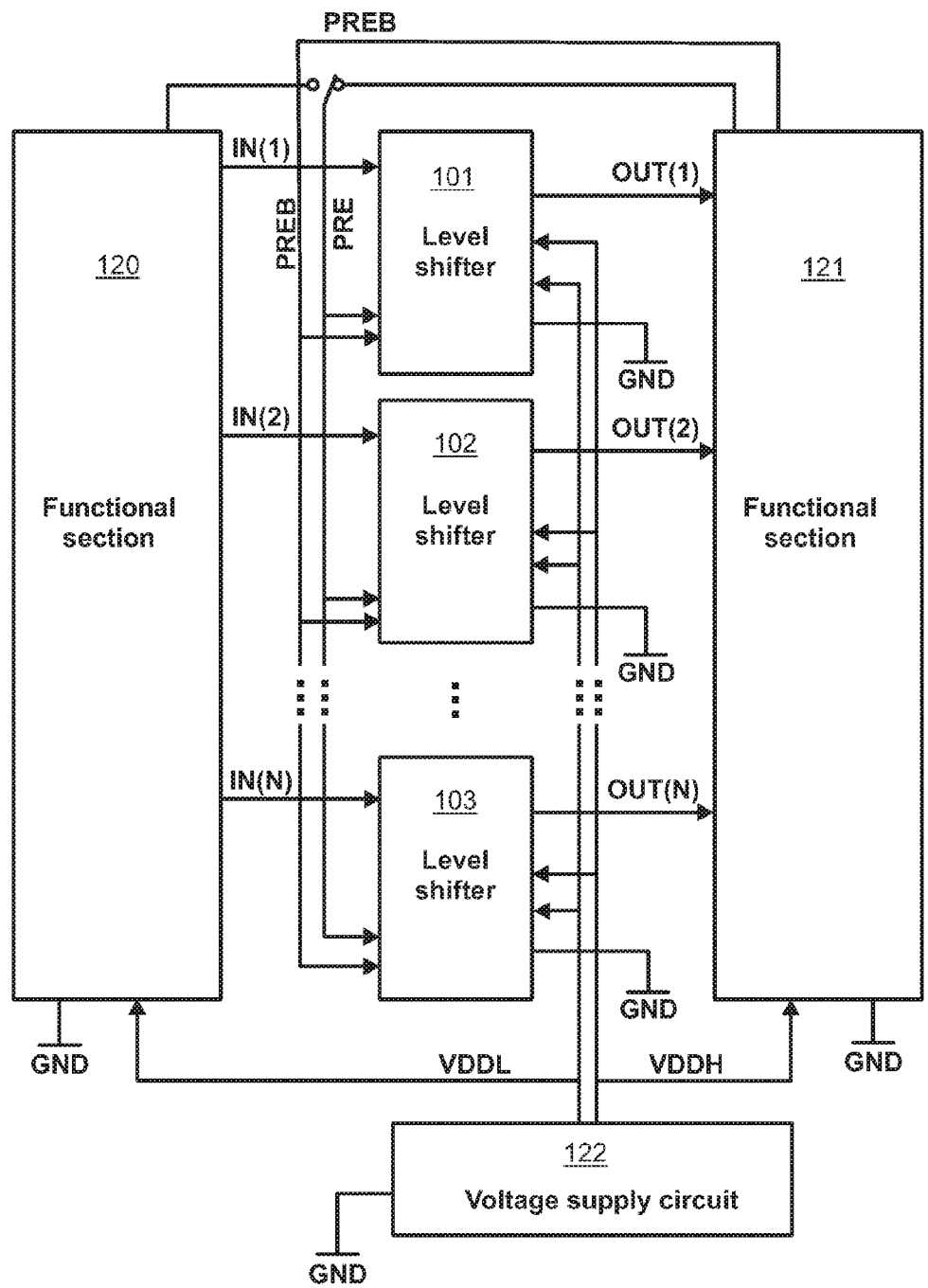
FIG. 1 shows a high-level block diagram of an electronic device comprising level shifters according to an exemplifying and non-limiting embodiment of the invention.

FIG. 1 shows a high-level block diagram of an electronic device that comprises level shifters according to an exemplifying and non-limiting embodiment of the invention. Three of the level shifters are denoted with references 101, 102 and 103. The electronic device comprises a first functional section 120 and a second functional section 121. The level shifters are configured to receive input signals IN(1) . . . IN(N) from the first functional section 120. The level shifters are configured produce output signals OUT(1) . . . OUT(N) based on the input signals, and supply the output signals to the second functional section 121. In this exemplifying case, the electronic device comprises a voltage supply circuit 122 configured to produce a first supply voltage VDDH and a second supply voltage VDDL so that the electric potential of the second supply voltage VDDL is between those of first supply voltage VDDH and a signal ground GND. Typically, the electric potential of the signal ground GND is deemed to be zero. The first functional section 120 may comprise for example one or more digital processors whose supply voltage is the second supply voltage VDDL, and the second functional section 121 may comprise for example one or more memory circuits whose supply voltage is the first supply voltage VDDH.

During a pre-charging phase, the input signals IN(1) . . . IN(N) are disabled from controlling the output signals OUT(1) . . . OUT(N) and the output terminals of the level shifters are pre-charged to the first supply voltage VDDH. In this exemplifying case, it is assumed that the first supply voltage VDDH is positive with respect to the signal ground GND. Thus, the first supply voltage VDDH represents the higher logical value of the output signals OUT(1) . . . OUT(N) and the signal ground GND represents the lower logical value of the output signals. During an evaluation phase subsequent to the pre-charging phase, each input signal which has its lower logical value controls the respective one of the output signals to its lower logical value. The lower logical value of the input signals IN(1) . . . IN(N) can be the signal ground GND, and the higher logical value of the input signals can be the second supply voltage VDDL. The second functional section 121 can be configured to control the above-mentioned pre-charging and evaluation phases for example so that a first pre-charging control signal PRE disables the input signals IN(1) . . . IN(N) from controlling the output signals OUT(1) . . . OUT(N) when the first pre-charging control signal PRE has its higher logical value, and a second pre-charging control signal PREB controls the level shifters to pre-charge their output terminals to the first supply voltage VDDH when the second pre-charging control signal PREB has its lower logical value. The evaluation phase begins when the first pre-charging control signal PRE has been changed to its lower logical value and the second pre-charging control signal PREB has been changed to its higher logical value. Advantageously, the first and second pre-charging control signals PRE and PREB are changed simultaneously or the second pre-charging control signal PREB is changed prior to changing the first pre-charging control signal PRE, i.e. the input signals IN(1) . . . IN(N) are not enabled to control the output signals OUT(1) . . . OUT(N) when the pre-charging takes place. The higher logical values of the first and second pre-charging control signals PRE and PREB can be e.g. the first supply voltage VDDH, and the lower logical values of the first and second pre-charging control signals can be the signal ground GND. Typically, the above-described operation where the second functional section 121 controls the pre-charging control signals PRE and PREB requires synchronization between the functional sections 120 and 121 so that timing information is delivered from the functional section 120 to the functional section 121. This synchronization can be implemented with suitable known ways. It is also possible that the first pre-charging control signal PRE comes from the first functional section 120 instead of the second functional section 121. In both cases, the pre-charging control signals PRE and PREB need to be synchronized with each other in order to avoid a situation where pull-up and pull-down paths of the level shifters are simultaneously in the conductive state.

Figure 2:
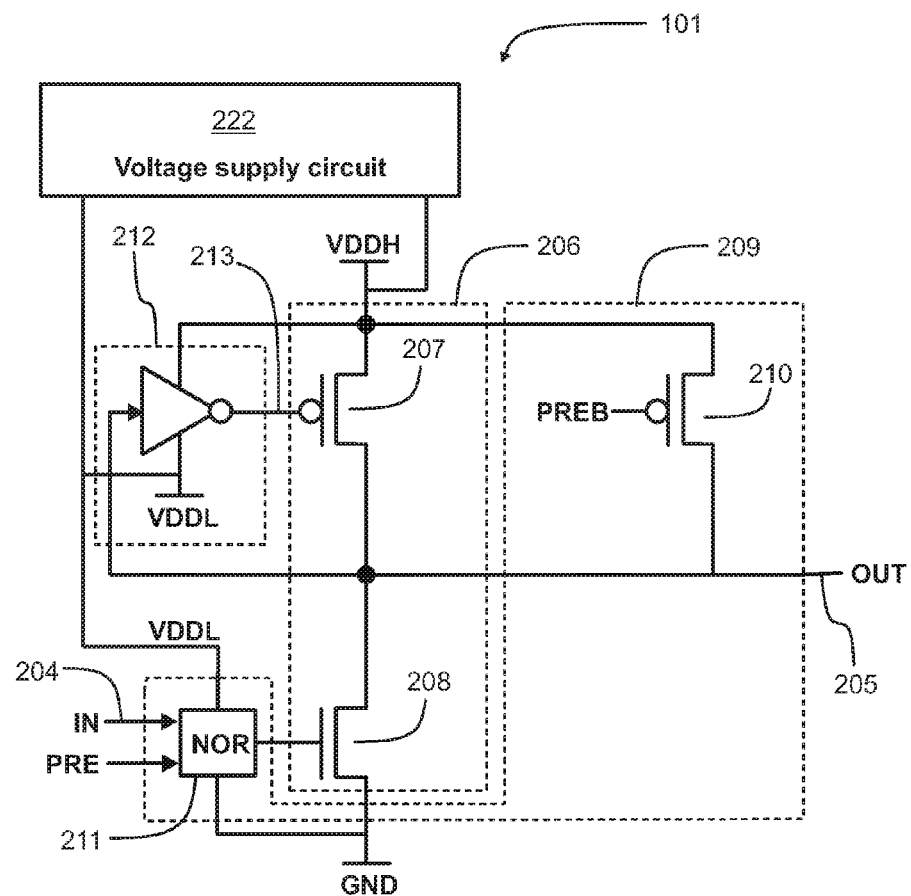
FIG. 2 shows a circuit diagram of a level shifter according to an exemplifying and non-limiting embodiment of the invention.

FIG. 2 shows a circuit diagram of the level shifter 101 shown in FIG. 1. The other level shifters shown in FIG. 1 can be similar to the level shifter 101. The level shifter 101 comprises an input terminal 204 for receiving the input signal IN and an output terminal 205 for outputting the output signal OUT. The level shifter 101 comprises a level shift circuit 206, a pre-charge circuit 209, and a keeper circuit 212. The level shift circuit 206 comprises a first control switch 207 for connecting the output terminal 205 to the first supply voltage VDDH so as to set the output signal OUT to its first logical value and a second control switch 208 for connecting the output terminal 205 to the signal ground GND so as to set the output signal OUT to its second logical value. In this exemplifying case, it is assumed that the first supply voltage VDDH that represents the first logical value of the output signal is positive with respect to the signal ground GND that represents the second logical value of the output signal. Thus, the first logical value of the output signal OUT is the higher logical value of the output signal and the second logical value of the output signal OUT is the lower logical value of the output signal. The first control switch 207 can be for example a p-channel metal oxide semiconductor field-effect transistor "PMOS", and the second control switch 208 can be for example an n-channel metal oxide semiconductor field-effect transistor "NMOS".

The pre-charge circuit 209 comprises a pre-charging switch 210 for connecting the output terminal to the first supply voltage VDDH. The pre-charging switch 210 is controlled with the aid of the second pre-charging control signal PREB. The pre-charging switch 210 can be for example a p-channel metal oxide semiconductor field-effect transistor "PMOS". In this exemplifying case, the pre-charging switch 210 is conductive when the second pre-charging control signal PREB has its lower logical value and non-conductive when the second pre-charging control signal PREB has its higher logical value. The pre-charge circuit 209 further comprises an input gate circuit 211 for controlling the ability of the input signal IN to control the second control switch 208. In this exemplifying case, the input gate circuit 211 comprises an inverting OR-gate, i.e. a NOR-gate for forming the NOR-function of the input signal IN and the first pre-charge control signal PRE. The output of the NOR-gate is connected to the control terminal of the second control switch 208. When the first pre-charge control signal PRE has its higher logical value, the output of the NOR-gate is the signal ground GND irrespective of the input signal IN. When the first pre-charge control signal PRE has its lower logical value and the input signal IN has its higher logical value, the output of the NOR-gate is the signal ground GND. When the first pre-charge control signal PRE has its lower logical value and the input signal IN has its lower logical value, the output of the NOR-gate is the second supply voltage VDDL. The second control switch 208 is conductive when the output of the NOR-gate is the second supply voltage VDDL, and the second control switch 208 is non-conductive when the output of the NOR-gate is the signal ground GND.

The keeper circuit 212 is responsive to the output signal OUT and connects the first supply voltage VDDH to the control terminal 213 of the first control switch 207 so as to keep the first control switch 207 non-conductive when the output signal OUT has its lower logical value, i.e. the signal ground GND. The keeper circuit 212 connects the second supply voltage VDDL to the control terminal 213 of the first control switch 207 so as to keep the first control switch 207 conductive when the output signal OUT has the higher logical value, i.e. the first supply voltage VDDH. In this exemplifying case, the keeper circuit 212 comprises an inverter whose input is configured to receive the output signal OUT and whose output is connected to the control terminal 213 of the first control switch. The higher output value of the inverter is the first supply voltage VDDH and the lower output value of the inverter is the second supply voltage VDDL.

A level shifter according to an exemplifying and non-limiting embodiment of the invention comprises a voltage supply circuit 222 configured to produce the first supply voltage VDDH and the second supply voltage VDDL so that the electric potential of the second supply voltage VDDL is between those of first supply voltage VDDH and the signal ground GND. The voltage supply circuit 222 may comprise for example linear regulators for controlling the VDDH and VDDL. As illustrated in FIG. 1, it is however also possible that a level shifter according to an exemplifying and non-limiting embodiment of the invention receives the first and second supply voltages VDDH and VDDL from a source that is external to the level shifter.

Figure 3:
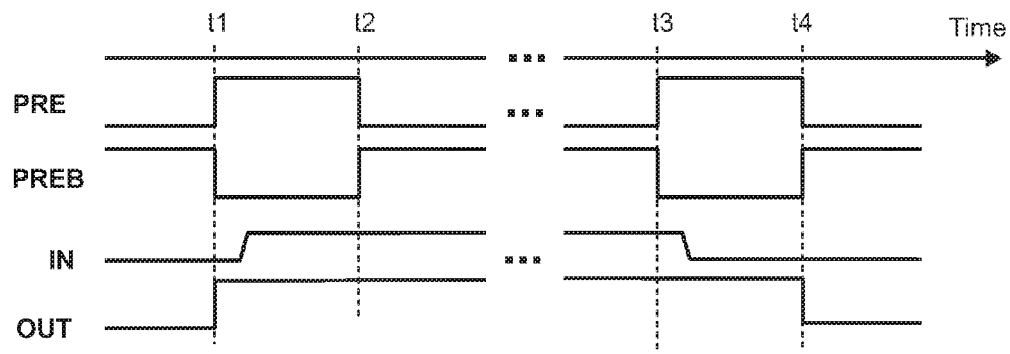
FIG. 3 illustrates the operation of the level shifter shown in FIG. 2.

FIG. 3 presents exemplifying cases which illustrate the operation of the level shifter 101. In the first exemplifying case, a pre-charging phase takes place between time instants t1 and t2. During the pre-charging phase, the first pre-charge control signal PRE has its higher logical value and the second pre-charge control signal PREB has its lower logical value. The pre-charging switch 210 is conductive and the input gate circuit 211 keeps the second control switch 208 non-conductive. It is assumed that the input signal IN changes from its lower logical value to its higher logical value during the pre-charging phase. This change of the input signal IN has, however, no effect during the pre-charging phase. The pre-charging phase ends and the subsequent evaluation phase begins at the time instant t2 when the second pre-charge control signal PREB is changed to its higher logical value and the first pre-charge control signal PRE is changed to its lower logical value. The change of the PREB to its higher logical value turns the pre-charging switch 210 to the non-conductive state and thereafter only the first control switch 207 which is controlled by the second supply voltage VDDL is keeping the output signal OUT at its higher logical value. The change of the PRE to its lower logical value enables the input signal IN to control the second control switch 208. As the input signal IN has its higher logical value during the evaluation phase, the second control switch 208 stays non-conductive and thus the output signal stays at its higher logical value.

In the second exemplifying case illustrated in FIG. 3, a pre-charging phase takes place between time instants t3 and t4. During the pre-charging phase, the first pre-charge control signal PRE has its higher logical value and the second pre-charge control signal PREB has its lower logical value. The pre-charging switch 210 is conductive and the input gate circuit 211 keeps the second control switch 208 non-conductive. It is assumed that the input signal IN changes from its higher logical value to its lower logical value during the pre-charging phase. This change of the input signal IN has, however, no effect during the pre-charging phase. The pre-charging phase ends and the subsequent evaluation phase begins at the time instant t4 when the second pre-charge control signal PREB is changed to its higher logical value and the first pre-charge control signal PRE is changed to its lower logical value. The change of the PREB to its higher logical value turns the pre-charging switch 210 to the non-conductive state and thereafter only the first control switch 207 which is controlled by the second supply voltage VDDL tends to keep the output signal OUT at its higher logical value. The change of the PRE to its lower logical value enables the input signal IN to control the second control switch 208. As the input signal IN has its lower logical value during the evaluation phase, the second supply voltage VDDL is conducted to the control terminal of the second control switch 208 and thus the second control switch 208 becomes conductive. The control terminal 213 of first control switch 207 is connected to the second supply voltage VDDL when the output signal OUT has its higher logical value. With suitable values of the second supply voltage VDDL, the ability of the first control switch 207 to keep the output signal OUT at its higher logical value is so weak that the second control switch 208 is sufficiently strong to pull the output signal OUT to its lower logical value when the input signal IN has its lower logical value and is enabled to control the second control switch 208. It is also possible to select the electrical properties of the first and second control switches 207 and 208, e.g. channel impedances of MOS transistors, so that the ability of the first control switch 207 to keep the output signal OUT at its higher logical value when controlled by the second supply voltage VDDL is sufficiently weaker than the ability of the second control switch 208 to pull the output signal OUT to its lower logical value when the input signal IN has its lower logical value and is enabled to control the second control switch 208. After the second control switch 208 has pulled the output signal OUT to its lower logical value, the keeper circuit 212 connects the first supply voltage VDDH to the control terminal 213 of the first control switch 207 and thus the first control switch 207 becomes non-conductive.

Figure 4:
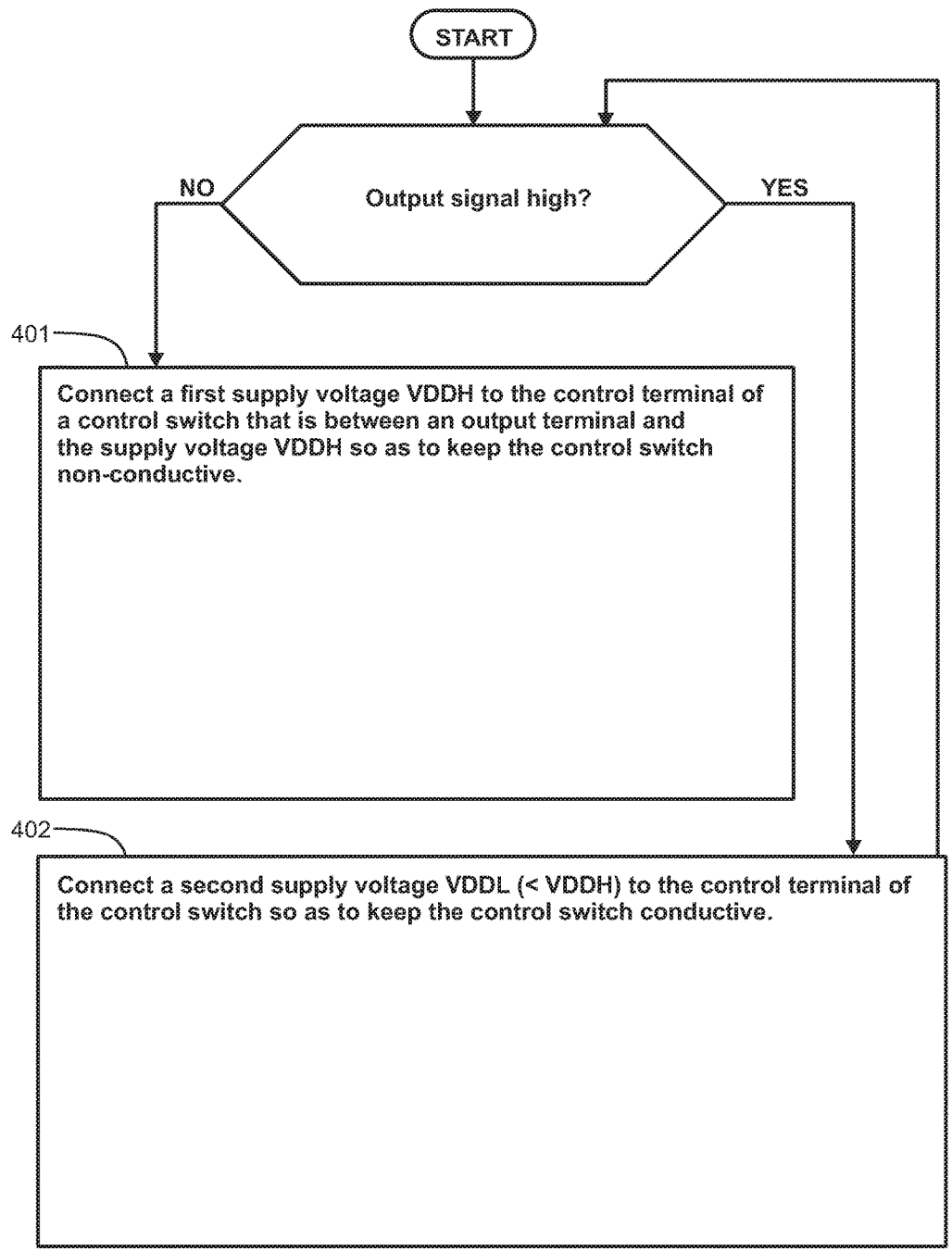
FIG. 4 shows a flowchart of a method according to an exemplifying and non-limiting embodiment of the invention for controlling a level shifter.

FIG. 4 shows a flowchart of a method according to an exemplifying and non-limiting embodiment of the invention for controlling a level shifter that comprises:
  an input terminal for receiving an input signal IN and an output terminal for outputting an output signal OUT,
  a level shift circuit comprising a first control switch for connecting the output terminal to a first supply voltage VDDH so as to set the output signal OUT to a first logical value and a second control switch for connecting the output terminal to a signal ground GND so as to set the output signal OUT to a second logical value, and
  a pre-charge circuit comprising a pre-charging switch for connecting the output terminal to the first supply voltage VDDH and an input gate circuit for controlling the ability of the input signal IN to control the second control switch.

The method comprises:
action 401: connecting the first supply voltage VDDH to the control terminal of the first control switch that is between the output terminal and the first supply voltage VDDH so as to keep the first control switch non-conductive when the output signal OUT has the second logical value, and
action 402: connecting a second supply voltage VDDL to the control terminal of the first control switch so as to keep the first control switch conductive when the output signal OUT has the first logical value, the electric potential of the second supply voltage VDDL being between those of first supply voltage VDDH and the signal ground GND.

In a method according to an exemplifying and non-limiting embodiment of the invention, the first control switch is controlled with an inverter whose input receives the output signal OUT and whose output is connected to the control terminal of the above-mentioned first control switch. The output of the inverter is connected to the first supply voltage VDDH when the output signal OUT has the second logical value and the output of the inverter is connected to the second supply voltage VDDL when the output signal OUT has the first logical value.

The specific examples provided in the description given above should not be construed as limiting the scope and/or the applicability of the appended claims. Lists and groups of examples provided in the description given above are not exhaustive unless otherwise explicitly stated.

What is claimed is:
1. A level shifter for producing an output signal based on an input signal, the level shifter comprising:
  an input terminal for receiving the input signal and an output terminal for outputting the output signal,
  a level shift circuit comprising a first control switch for connecting the output terminal to a first supply voltage so as to set the output signal to a first logical value and a second control switch for connecting the output terminal to a signal ground so as to set the output signal to a second logical value,
  a pre-charge circuit comprising a pre-charging switch for connecting the output terminal to the first supply voltage and an input gate circuit for controlling an ability of the input signal to control the second control switch, and
  a keeper circuit responsive to the output signal and for connecting the first supply voltage to a control terminal of the first control switch so as to keep the first control switch non-conductive when the output signal has the second logical value, wherein the keeper circuit is configured to connect a second supply voltage to the control terminal of the first control switch so as to keep the first control switch conductive when the output signal has the first logical value.

2. A level shifter according to claim 1, wherein the first control switch is a p-channel metal oxide semiconductor field-effect transistor and the second control switch is an n-channel metal oxide semiconductor field-effect transistor.

3. A level shifter according to claim 1, wherein the pre-charging switch is a p-channel metal oxide semiconductor field-effect transistor.

4. A level shifter according to claim 1, wherein, the input gate circuit comprises a NOR-gate for forming a NOR-function of the input signal and a pre-charge control signal and for supplying the NOR-function to a control terminal of the second control switch.

5. A level shifter according to claim 1, wherein the keeper circuit comprises an inverter whose input is configured to receive the output signal and whose output is connected to the control terminal of the first control switch, the output of the inverter being connected to the first supply voltage when the output signal has the second logical value, and the output of the inverter being connected to the second supply voltage when the output signal has the first logical value.

6. A level shifter according to claim 1, wherein the level shifter comprises a voltage supply circuit configured to produce the first supply voltage and the second supply voltage so that an electric potential of the second supply voltage is between those of first supply voltage and the signal ground.

7. An electronic device comprising:
a first functional section and a second functional section,
one or more level shifters according to claim 1, and configured to receive one or more input signals from the first functional section, produce one or more output signals based on the one or more input signals, and supply the one or more output signals to the second functional section, and
a voltage supply circuit configured to produce the first supply voltage and the second supply voltage and supply the first and second supply voltages to the one or more level shifters, an electric potential of the second supply voltage being between those of first supply voltage and the signal ground.

8. A method for controlling a level shifter, wherein the lever shifter comprises:
an input terminal for receiving an input signal and an output terminal for outputting an output signal,
a level shift circuit comprising a first control switch for connecting the output terminal to a first supply voltage so as to set the output signal to a first logical value and a second control switch for connecting the output terminal to a signal ground so as to set the output signal to a second logical value, and
a pre-charge circuit comprising a pre-charging switch for connecting the output terminal to the first supply voltage and an input gate circuit for controlling an ability of the input signal to control the second control switch,
the method comprising:
connecting the first supply voltage to a control terminal of the first control switch so as to keep the first control switch non-conductive when the output signal has the second logical value,
wherein the method comprises connecting a second supply voltage to the control terminal of the first control switch so as to keep the first control switch conductive when the output signal has the first logical value, an electric potential of the second supply voltage being between those of first supply voltage and the signal ground.

9. A method according to claim 8, wherein the first control switch is controlled with an inverter whose input receives the output signal and whose output is connected to the control terminal of the first control switch, the output of the inverter being connected to the first supply voltage when the output signal has the second logical value, and the output of the inverter being connected to the second supply voltage when the output signal has the first logical value.

* * * * *